United States Patent
Nitta et al.

(10) Patent No.: US 7,522,465 B2
(45) Date of Patent: Apr. 21, 2009

(54) SEMICONDUCTOR MEMORY DEVICE, AND DATA TRANSMITTING/RECEIVING SYSTEM

(75) Inventors: Tadashi Nitta, Kyoto (JP); Kazuyo Nishikawa, Osaka (JP); Masahiro Ueminami, Kyoto (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 11/712,467

(22) Filed: Mar. 1, 2007

(65) Prior Publication Data

US 2007/0274148 A1    Nov. 29, 2007

(30) Foreign Application Priority Data

Mar. 30, 2006    (JP) .............................. 2006-094029

(51) Int. Cl.
*G11C 5/14* (2006.01)

(52) U.S. Cl. .................................. 365/226; 365/189.11

(58) Field of Classification Search .................. 365/226, 365/189.11

See application file for complete search history.

(56) References Cited

U.S. PATENT DOCUMENTS

| 6,160,736 A | 12/2000 | Kurosaki | |
|---|---|---|---|
| 6,483,748 B2 * | 11/2002 | Futatsuya et al. | 365/185.11 |
| 7,366,034 B2 * | 4/2008 | Kozakai et al. | 365/189.05 |

FOREIGN PATENT DOCUMENTS

| JP | 2003-132691 | 5/2003 |
|---|---|---|
| JP | 2005-100625 | 4/2005 |

* cited by examiner

*Primary Examiner*—Tuan T. Nguyen
(74) *Attorney, Agent, or Firm*—McDermott Will & Emery LLP

(57) ABSTRACT

A semiconductor memory device includes: a power supply circuit for outputting a power supply voltage used for reading out data; and a power supply circuit status determination circuit for determining whether an operation status of the power supply circuit is such that data can be read out normally. The output of readout data is suppressed while it is determined by the power supply circuit status determination circuit that the operation status is such that data cannot be read out normally.

13 Claims, 8 Drawing Sheets

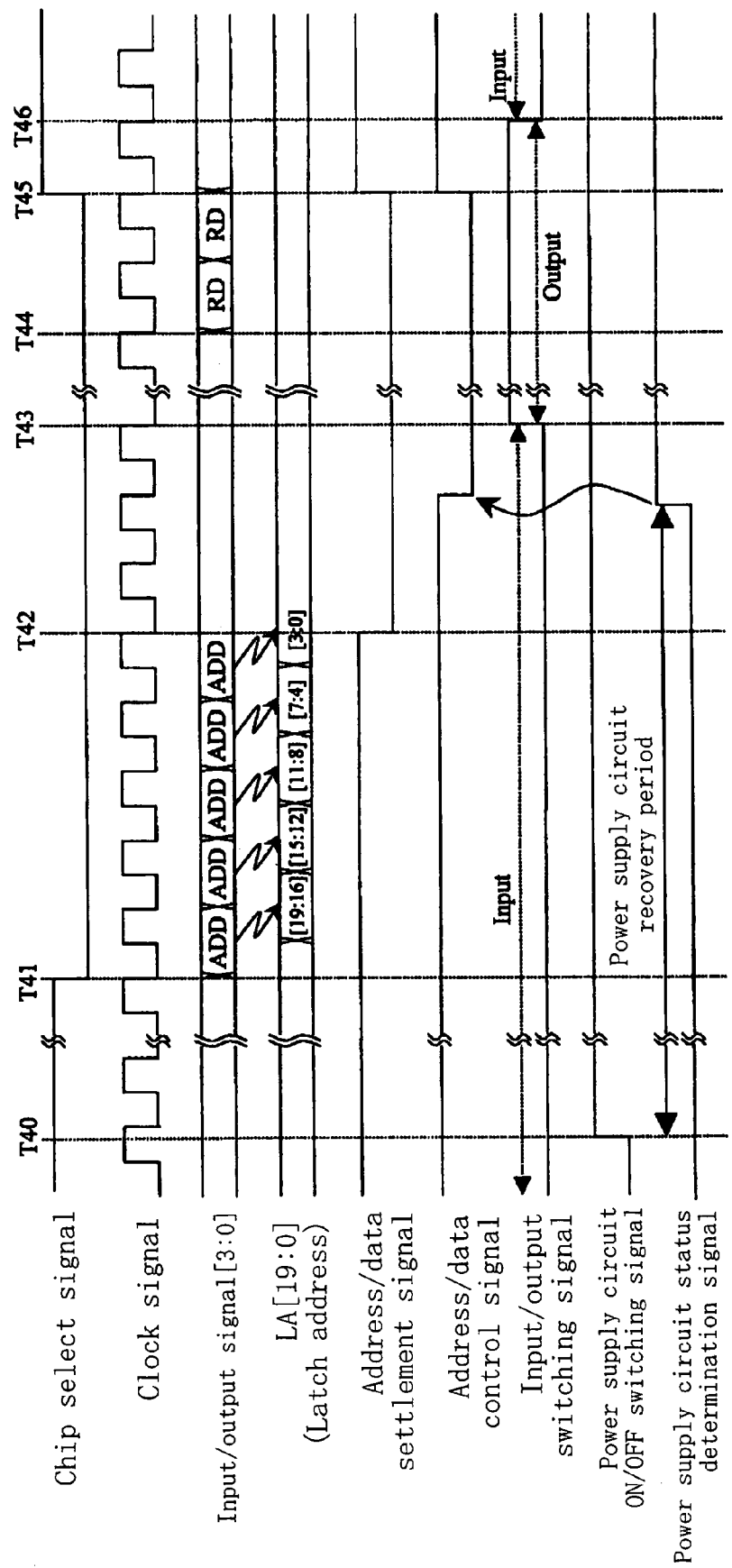

SEMICONDUCTOR MEMORY DEVICE, AND DATA TRANSMITTING/RECEIVING SYSTEM

CROSS REFERENCE TO RELATED APPLICATION

This application claims priority under 35 U.S.C. §119 on Patent Application No. 2006-094029 filed in Japan on Mar. 30, 2006, the entire contents of which are hereby incorporated by reference.

BACKGROUND OF THE INVENTION

1. Field of the Invention

The present invention relates to a semiconductor memory device and, more particularly, to a semiconductor memory device in which a voltage output by a power supply circuit having a voltage booster circuit is used for reading out stored data.

2. Description of the Background Art

A conventional non-volatile semiconductor memory as shown in FIG. 3 of Japanese Laid-Open Patent Publication No. 2003-132691 is known in the art. The non-volatile semiconductor memory outputs a ready_to_read signal, which is a logical product of two signals, one indicating that a read charge pump has been charged up after the rising of the power supply voltage, and another indicating that a predetermined amount of time has elapsed since the rising of the power supply voltage. By inputting the ready_to_read signal to a data processing device connected to the non-volatile semiconductor memory, it is possible to prevent the data processing device from running out of control.

SUMMARY OF THE INVENTION

However, this conventional non-volatile semiconductor memory requires a dedicated terminal (pin) for outputting the ready_to_read signal, thus increasing the total number of terminals.

An object of the present invention is to reduce the number of terminals of a semiconductor memory device.

In order to achieve the object set forth above, a first semiconductor memory device of the present invention includes: a power supply circuit for outputting a power supply voltage used for reading out data; and a power supply circuit status determination circuit for determining whether an operation status of the power supply circuit is such that data can be read out normally, wherein output of readout data is suppressed while it is determined by the power supply circuit status determination circuit that the operation status is such that data cannot be read out normally.

A second semiconductor memory device of the present invention is the first semiconductor memory device, wherein the power supply circuit has a voltage booster circuit.

A third semiconductor memory device of the present invention is the first semiconductor memory device, wherein predetermined data is output instead of the readout data while it is determined by the power supply circuit status determination circuit that the operation status is such that data cannot be read out normally.

A fourth semiconductor memory device of the present invention is the first semiconductor memory device, wherein: a read address is received and the readout data is output via a common terminal; and the terminal accepts the read address while it is determined by the power supply circuit status determination circuit that the operation status is such that data cannot be read out normally.

A fifth semiconductor memory device of the present invention is the first semiconductor memory device, wherein the power supply circuit status determination circuit determines whether the operation status is such that data can be read out normally based on a level of the power supply voltage.

A sixth semiconductor memory device of the present invention is the fifth semiconductor memory device, wherein the power supply circuit status determination circuit determines that the operation status is such that data can be read out normally when the level of the power supply voltage is greater than or equal to a predetermined level, and determines that the operation status is such that data cannot be read out normally when the level of the power supply voltage is less than the predetermined level.

With the first to sixth semiconductor memory devices, it is possible to prevent erroneous data from being read out, without providing a semiconductor memory device with a dedicated terminal for outputting a signal that indicates whether the operation status of the power supply circuit is such that data can be read out normally. Thus, the number of terminals of the semiconductor memory device can be reduced.

A seventh semiconductor memory device of the present invention is the sixth semiconductor memory device, further including an address holding circuit for holding an address that is input before it is determined by the power supply circuit status determination circuit that the operation status is such that data can be read out normally after start-up of the power supply circuit, wherein the address held by the address holding circuit is used for reading out data after it is determined by the power supply circuit status determination circuit that the operation status is such that data can be read out normally and input of the readout address is completed.

An eighth semiconductor memory device of the present invention is the seventh semiconductor memory device, wherein the power supply circuit starts up and shuts down according to a power supply circuit ON/OFF switching signal, which is input from outside the semiconductor memory device.

A ninth semiconductor memory device of the present invention is the seventh semiconductor memory device, further including a command interpretation circuit for determining whether a predetermined address or predetermined data has been input from outside the semiconductor memory device, wherein the power supply circuit starts up or shuts down when it is determined that the predetermined address or the predetermined data has been input.

A tenth semiconductor memory device of the present invention is the ninth semiconductor memory device, wherein: the command interpretation circuit determines whether a pair of a predetermined address and predetermined data has been input a predetermined number of times; and the power supply circuit starts up or shuts down when the pair has been input the predetermined number of times.

An eleventh semiconductor memory device of the present invention is the tenth semiconductor memory device, wherein an address and data, which are input as serial data, are received in synchronism with a clock signal having a predetermined period.

A twelfth semiconductor memory device of the present invention is the eleventh semiconductor memory device, wherein the address and the data are received and the readout data is output via a common terminal.

With the seventh to twelfth semiconductor memory devices, after it is determined that the operation status of the power supply circuit is such that data can be read out normally, the read operation can be started immediately, thus shortening the amount of time required for reading out data.

A data transmitting/receiving system of the present invention includes: the seventh semiconductor memory device; and an information processing device for outputting an address, data and a control signal for controlling the semiconductor memory device, which are input to the semiconductor memory device, and for receiving readout data, which is output from the semiconductor memory device.

With the data transmitting/receiving system, it is possible to prevent the information processing device from running out of control, which would occur when erroneous data is read out, without providing a signal line between the semiconductor memory device and the information processing device for transmitting a signal that indicates whether the operation status of the power supply circuit is such that data can be read out normally.

BRIEF DESCRIPTION OF THE DRAWINGS

FIG. 8 is a timing diagram showing an operation of the semiconductor memory device 400 of Embodiment 4.

DETAILED DESCRIPTION OF THE INVENTION

Figure 1:
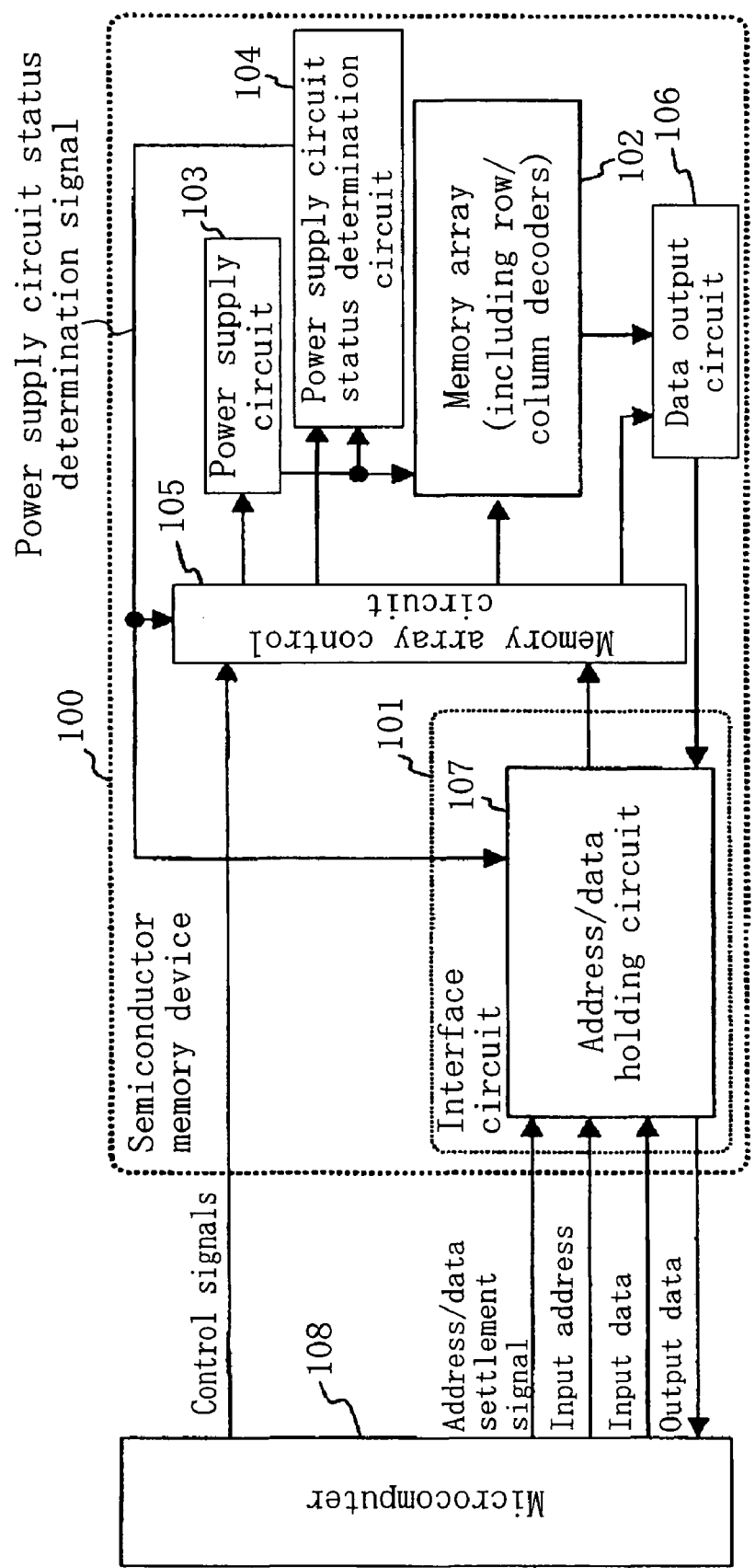
FIG. 1 is a block diagram showing a configuration of a semiconductor memory device 100 of Embodiment 1.

Preferred embodiments of the present invention will now be described with reference to the drawings. Note that in each of the following embodiments, like elements to those of any preceding embodiments will be denoted by like reference numerals, and will not be described repeatedly.

Embodiment 1

Referring to FIG. 1, the semiconductor memory device 100 includes an interface circuit 101, a memory array 102, a power supply circuit 103 having a voltage boosting function, a power supply circuit status determination circuit 104, a memory array control circuit 105, and a data output circuit 106.

The semiconductor memory device 100 receives, from a microcomputer 108, a plurality of control signals for controlling the semiconductor memory device 100, an address/data settlement signal, an input address, and input data. The plurality of control signals include a chip select signal, and a power supply circuit ON/OFF switching signal. The semiconductor memory device 100 outputs output data to the microcomputer 108. These signals are exchanged between the semiconductor memory device 100 and the microcomputer 108 in parallel transmission as shown in FIG. 1.

The chip select signal is a signal for controlling the validity of a read operation, a write operation, or the like of the semiconductor memory device 100. When the chip select signal is low, the address, the data and other control signals are valid. When the chip select signal is high, the semiconductor memory device 100 does not operate even if it receives an address, data and other control signals.

The address/data settlement signal is a signal that indicates when the signal level of the input address has become stable.

The interface circuit 101 includes an address/data holding circuit 107. The address/data holding circuit 107 receives from the microcomputer 108, holds, and outputs, the input address and the input data representing a command, or the like.

The memory array 102 includes a row decoder, a column decoder and one or more non-volatile memory cells, and receives the input address and the input data representing a command, or the like, via the interface circuit 101. The structure of the memory array 102 is not limited to the NOR type, the NAND type or the AND type, but may be of any type as long as data, each being "0" or "1", stored in the memory cells can be read out.

The power supply circuit 103 has a voltage boosting function, and produces and outputs a power supply voltage required for reading out data stored in the memory array 102. More specifically, for example, the power supply circuit 103 boosts a voltage input from outside the semiconductor memory device 100, stabilizes and outputs the boosted voltage. The power supply circuit 103 starts up and shuts down according to the power supply circuit ON/OFF switching signal. Specifically, the power supply circuit 103 is operative when the power supply circuit ON/OFF switching signal is high and inoperative when it is low.

The power supply circuit status determination circuit 104 monitors the status of the power supply circuit 103 to determine whether the operation status of the power supply circuit 103 is such that data can be read out properly, and outputs a power supply circuit status determination signal representing the determination result. Specifically, the determination is made by, for example, detecting the level of the power supply voltage output from the power supply circuit 103 and comparing the detected level with a predetermined voltage level. If the detected power supply voltage level is greater than or equal to the predetermined voltage level, the power supply circuit status determination circuit 104 determines that the operation status of the power supply circuit 103 is such that data can be read out properly, and outputs the power supply circuit status determination signal being high. If the detected power supply voltage level is less than the predetermined voltage level, the power supply circuit status determination circuit 104 determines that the operation status of the power supply circuit 103 is such that data cannot be read out properly, and outputs the power supply circuit status determination signal being low.

The data output circuit 106 determines whether the data stored in the memory cell of the memory array 102 is "0" or "1", and outputs the readout data.

The memory array control circuit 105 controls the power supply circuit 103, the power supply circuit status determination circuit 104, and the data output circuit 106 according to the plurality of control signals and the power supply circuit status determination signal. Moreover, according to the input address output from the address/data holding circuit 107, the memory array control circuit 105 controls the row decoder and the column decoder of the memory array 102 to select a memory cell. When the power supply circuit status determination signal is high, the memory array control circuit 105 controls the various circuits specified above so as to read out data from the memory array 102 according to the plurality of control signals and the input address output from the address/data holding circuit 107. When the power supply circuit status determination signal is low, the memory array control circuit 105 controls the various circuits specified above so that data is not read out, irrespective of the plurality of control signals, and the input address output from the address/data holding circuit 107.

The address/data holding circuit 107 receives the input address and the input data from the microcomputer 108. The address/data holding circuit 107 outputs the input address and the input data when the address/data settlement signal goes low. Moreover, the address/data holding circuit 107 receives the readout data from the data output circuit 106, and outputs the readout data as the output data. The output data is input to the microcomputer 108.

If the power supply circuit status determination signal output from the power supply circuit status determination circuit 104 goes low during a read operation, the address/data holding circuit 107 outputs, as the output data, read error data indicating a read error, instead of outputting readout data. The read error data may be a string of "0" bits or a string of "1" bits. The read error data may also be any other data that is pre-defined as error data. The present invention is not limited to outputting data that is defined as error data, but read errors can be indicated by other means, e.g., outputting two data inverted from each other alternately at regular intervals.

Figure 2:
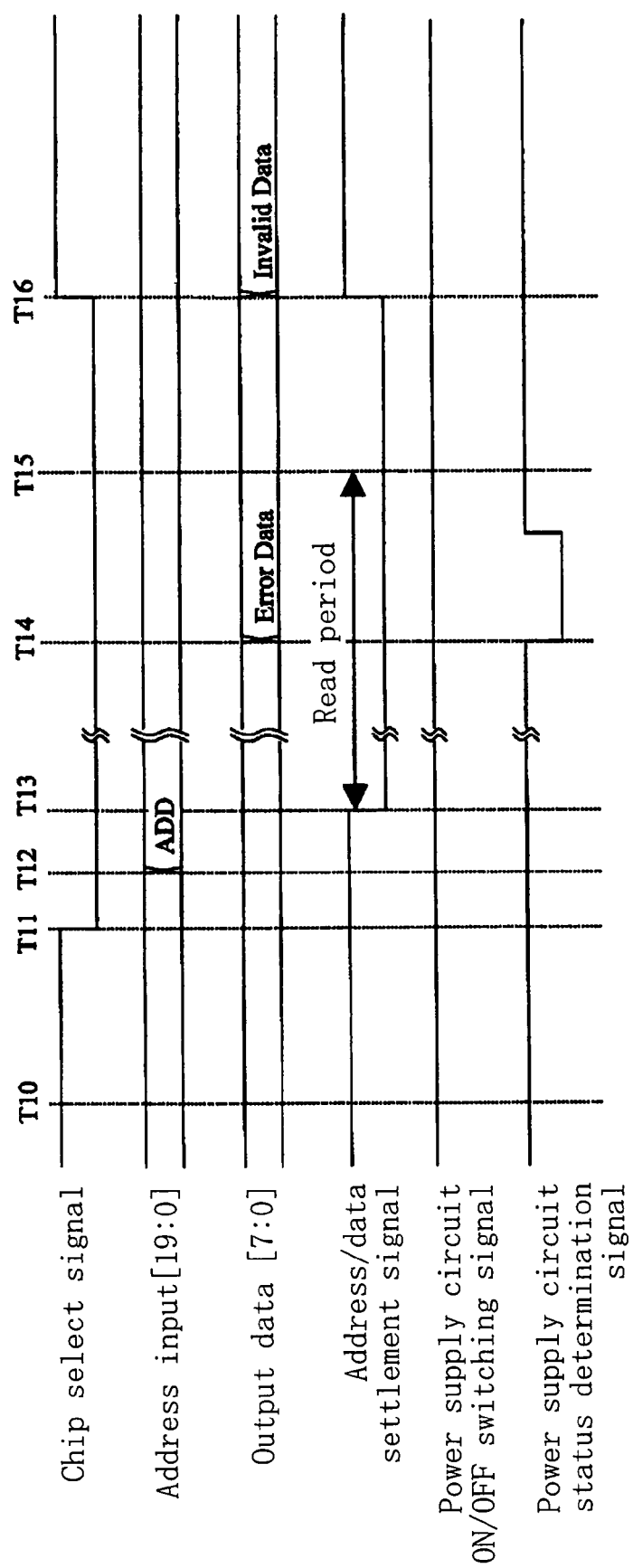
FIG. 2 is a timing diagram showing an operation of the semiconductor memory device 100 of Embodiment 1.

FIG. 2 is a timing diagram showing an operation of the semiconductor memory device 100 of the present embodiment. In this illustrated example, the input address is 20-bit data, and the output data is 8-bit data.

At time T10, the power supply circuit ON/OFF switching signal is high, whereby the power supply circuit 103 is operative, and the power supply circuit status determination signal from the power supply circuit status determination circuit 104 is high. The microcomputer 108 brings the chip select signal to low at time T11, and then outputs the input address, being a read address, at time T12. The input address is input to the semiconductor memory device 100, and held by the address/data holding circuit 107. When the address/data settlement signal goes low at time T13, the input address held by the address/data holding circuit 107 is transferred to the memory array control circuit 105, and a read operation is started.

If the power supply circuit 103 shuts down or the operation thereof otherwise becomes incomplete during a read operation by the semiconductor memory device 100, and the power supply circuit 103 no longer outputs the power supply voltage of a sufficient voltage level for performing the read operation, the power supply circuit status determination signal goes low (time T14). Upon receiving the power supply circuit status determination signal being low, the memory array control circuit 105 controls various circuits so as to stop the read operation. The address/data holding circuit 107 outputs, as the output data, read error data, instead of outputting the readout data. When the read error data is output and the read period ends (time T15), the microcomputer 108 brings the address/data settlement signal to high and the chip select signal to high at time T16. Thus, a read operation sequence is completed.

As described above, when the power supply circuit no longer outputs the power supply voltage of a sufficient voltage level for performing the read operation, the semiconductor memory device 100 of the present embodiment outputs error data, instead of outputting the readout data. Therefore, by providing the microcomputer 108 with a function of handling the error data not as normal readout data, it is possible to easily prevent the microcomputer 108 from running out of control, which would occur when erroneous data is read out due to incomplete operation of the power supply circuit.

Moreover, the error data is output to a terminal for readout data. Therefore, the semiconductor memory device 100 does not have to be provided with a dedicated terminal for outputting a signal indicating that the status of the power supply circuit is such that data cannot be read out normally.

Embodiment 2

Figure 3:
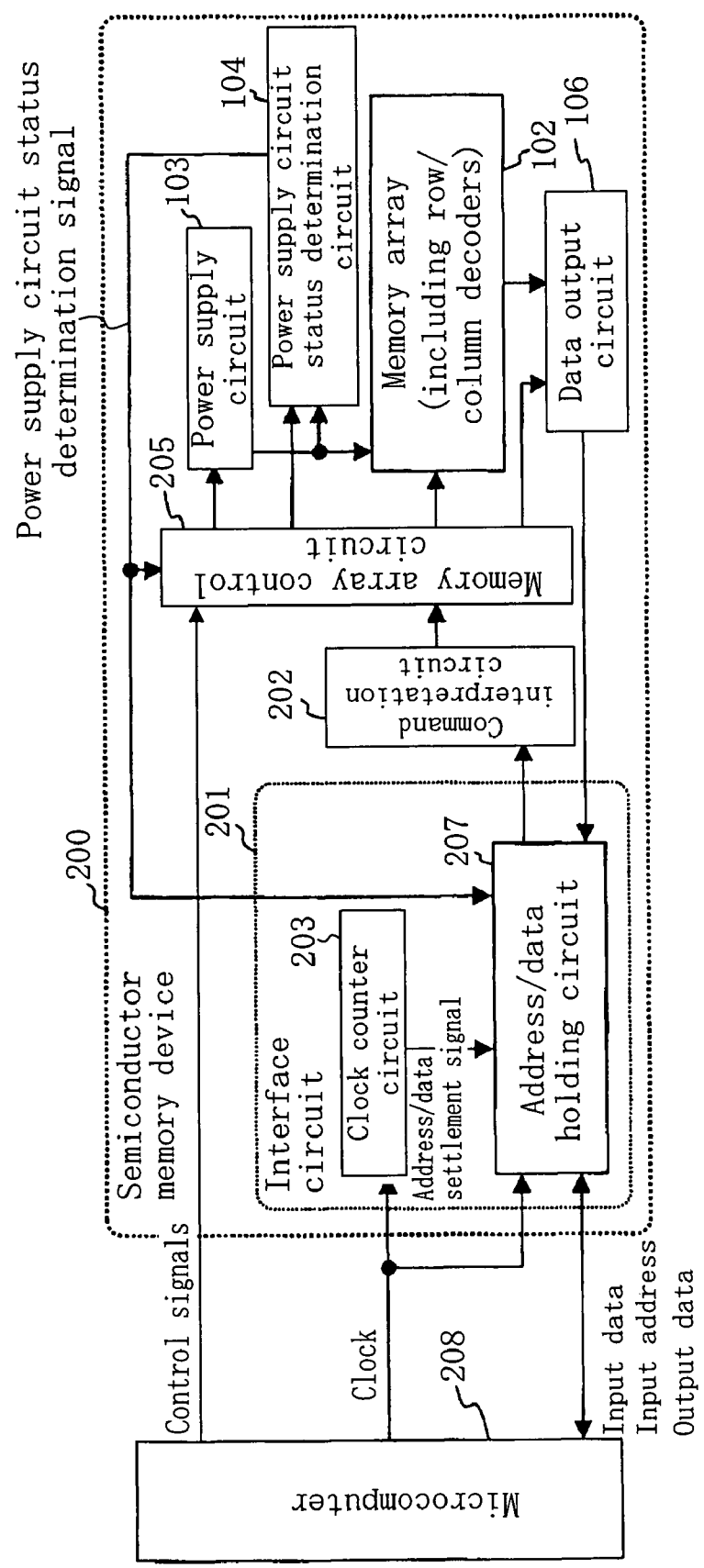
FIG. 3 is a block diagram showing a configuration of a semiconductor memory device 200 of Embodiment 2.

Referring to FIG. 3, a semiconductor memory device 200 of Embodiment 2 includes an interface circuit 201, a command interpretation circuit 202, the memory array 102, the power supply circuit 103 having a voltage boosting function, the power supply circuit status determination circuit 104, a memory array control circuit 205, and the data output circuit 106. The interface circuit 201 includes a clock counter circuit 203 and an address/data holding circuit 207.

The semiconductor memory device 200 receives, from a microcomputer 208, a plurality of control signals for controlling the semiconductor memory device 200, a clock signal, an input address, and input data. The plurality of control signals include a chip select signal. The semiconductor memory device 200 outputs output data to the microcomputer 208. In the present embodiment, the input address, the input data and the output data are exchanged between the semiconductor memory device 200 and the microcomputer 208 in serial transmission as shown in FIG. 3. The semiconductor memory device 200 receives the input address and the input data, and outputs the output data via common terminals.

The chip select signal is a signal for controlling the validity of a read operation, a write operation, or the like of the semiconductor memory device 200. When the chip select signal is low, the address, the data and other control signals are valid. When the chip select signal is high, the semiconductor memory device 200 does not operate even if it receives an address, data and other control signals.

The command interpretation circuit 202 issues a command signal for controlling the memory array control circuit 205 by interpreting the input address and the input data output from the address/data holding circuit 207. Moreover, the command interpretation circuit 202 determines if a pair of a predetermined address and predetermined write data has been input a predetermined number of times. If so, the command interpretation circuit 202 outputs the power supply circuit ON/OFF switching signal being high. Otherwise, the command interpretation circuit 202 outputs the power supply circuit ON/OFF switching signal being low.

The interface circuit 201 outputs data received from the microcomputer 208 and a command. The output data and command are input to the command interpretation circuit 202.

The clock counter circuit 203 counts the oscillation of the clock signal from the microcomputer 208, and outputs the address/data settlement signal when the count reaches a predetermined clock count. The counting starts when the chip select signal goes low (when the memory array 102 is selected) for a read operation. The count of the clock counter circuit 203 is reset when the chip select signal goes high (when the memory array 102 becomes unselected). The address/data settlement signal is a signal indicating that the signal level of the input address to be received has become stable.

According to the plurality of control signals and the command signal output from the command interpretation circuit 202, the memory array control circuit 205 controls the power supply circuit 103, the power supply circuit status determination circuit 104 and the data output circuit 106, and controls the row decoder and the column decoder of the memory array 102 to select a memory cell. When the power supply circuit status determination signal is high, the memory array control circuit 205 controls the various circuits specified above so as to read out data from the memory array 102 according to the plurality of control signals and the input address output from the address/data holding circuit 207. When the power supply circuit status determination signal is low, the memory array control circuit 205 controls the various circuits so that the read operation is stopped, irrespective of the plurality of control signals, and the input address output from the address/data holding circuit 207.

The address/data holding circuit 207 receives, in synchronism with a clock signal having a predetermined period, the input address and the input data received as serial data from the microcomputer 208, and outputs the received input address and the input data in response to the address/data settlement signal output from the clock counter circuit 203. Moreover, the address/data holding circuit 207 receives the readout data output from the data output circuit 106, and outputs the readout data to the microcomputer 208 as the output data. If the power supply circuit status determination signal output from the power supply circuit status determination circuit 104 goes low during a read operation, the address/data holding circuit 207 outputs read error data indicating a read error, instead of outputting readout data. The read error data may be a string of "0" bits or a string of "1" bits. The read error data may also be any other data that is pre-defined as error data. The present invention is not limited to outputting data that is defined as error data, but read errors can be indicated by other means, e.g., outputting two data inverted from each other alternately at regular intervals.

The address/data holding circuit 207 is switched by an input/output switching signal between a state where it receives the input address and the input data and another state where it outputs the output data. The input/output switching signal is an internal signal of the address/data holding circuit 207. When the input/output switching signal is low, the address/data holding circuit 207 is in a state where it receives the input address and the input data. When the input/output switching signal is high, the address/data holding circuit 207 is in a state where it outputs the output data.

Figure 4:
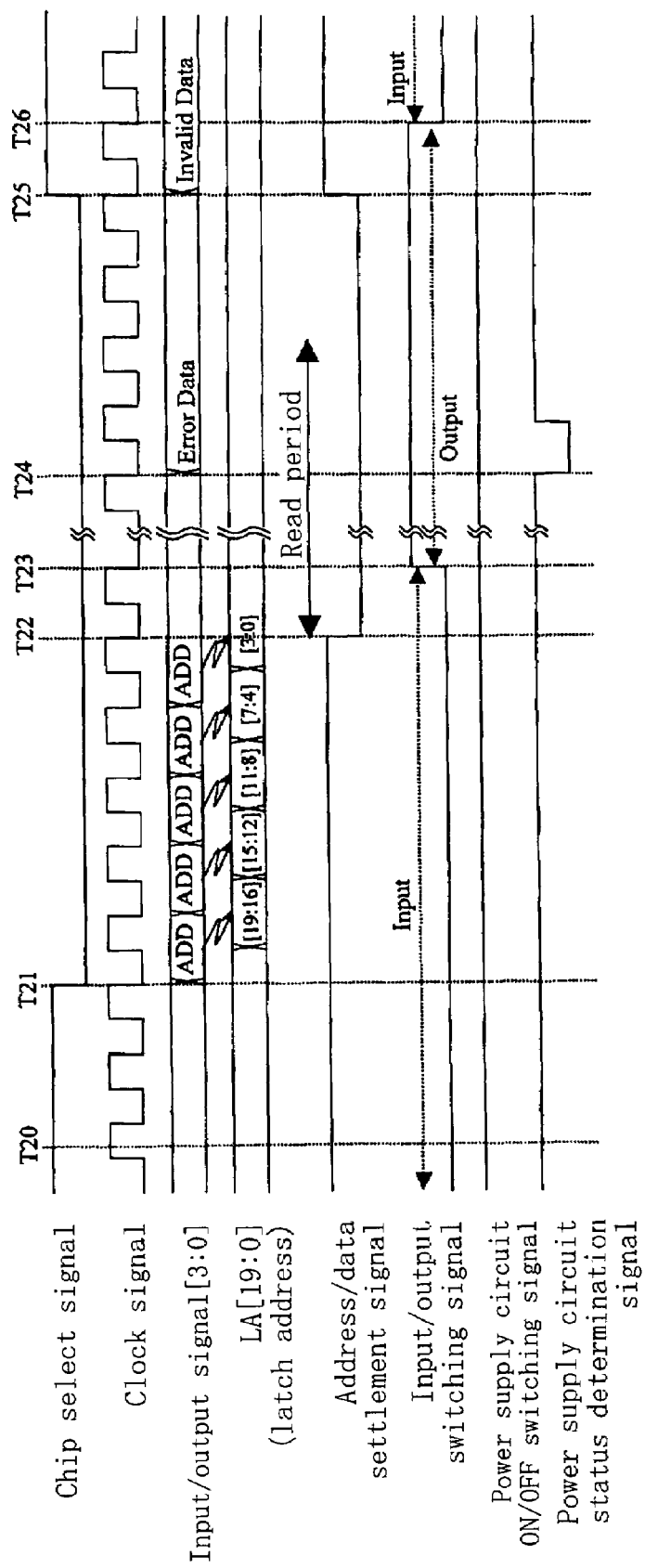
FIG. 4 is a timing diagram showing an operation of the semiconductor memory device 200 of Embodiment 2.

FIG. 4 is a timing diagram showing an operation of the semiconductor memory device 200 of the present embodiment. In the illustrated example, the input address, the input data and the output data are exchanged via a 4-bit bus, the input address is 20-bit data, and the output data is 8-bit data. The latch address LA[19:0] is an address held by the address/data holding circuit 207.

At time T20, the power supply circuit ON/OFF switching signal is high, whereby the power supply circuit 103 is operative, and the power supply circuit status determination signal from the power supply circuit status determination circuit 104 is high.

After the microcomputer 208 brings the chip select signal to low at time T21, the input address, being a read address, is input from the microcomputer 208 to the semiconductor memory device 200 by 4 bits in synchronism with the clock signal. The received input address is stored in the address/data holding circuit 207, successively taking up storage positions starting from the position corresponding to the most significant bits of the latch address LA[19:0]. When the read address has been stored in the storage positions corresponding to all the bits of the latch address LA[19:0] of the address/data holding circuit 207 at time T22, the address/data settlement signal goes low, the latch address LA[19:0] is transmitted to the command interpretation circuit 202, and a read operation is started. In response to the address/data settlement signal going low, the input/output switching signal goes high at time T23, and the address/data holding circuit 207 enters a state where it is capable of outputting the output data.

If the power supply circuit 103 shuts down or the operation thereof otherwise becomes incomplete during a read operation by the semiconductor memory device 200, and the power supply circuit 103 no longer outputs the power supply voltage of a sufficient voltage level for performing the read operation, the power supply circuit status determination signal goes low (time T24).

Upon receiving the power supply circuit status determination signal being low, the memory array control circuit 205 controls various circuits so as to stop the read operation. The address/data holding circuit 207 outputs, as the output data, read error data, instead of outputting the readout data.

When the read error data is output and the read period ends (time T25), the address/data settlement signal goes high at time T25. Moreover, the microcomputer 208 brings the chip select signal to high, thus completing the read operation sequence. In response to the address/data settlement signal going high, the input/output switching signal goes low at time T26, and the address/data holding circuit 207 then enters a state where it receives the input address and the input data.

As described above, when the power supply circuit 103 no longer outputs the power supply voltage of a sufficient voltage level for performing the read operation, the semiconductor memory device 200 of the present embodiment outputs error data, instead of outputting the readout data. Therefore, by providing the microcomputer 208 with a function of waiting until data is read out normally after the microcomputer 208 recognizes the error data, it is possible to easily prevent the microcomputer 208 from running out of control, which would occur when erroneous data is read out due to incomplete operation of the power supply circuit 103.

Moreover, the error data is output to a terminal for readout data. Therefore, the semiconductor memory device 200 does not have to be provided with a dedicated terminal for outputting a signal indicating that the status of the power supply circuit is such that data cannot be read out normally.

Embodiment 3

Figure 5:
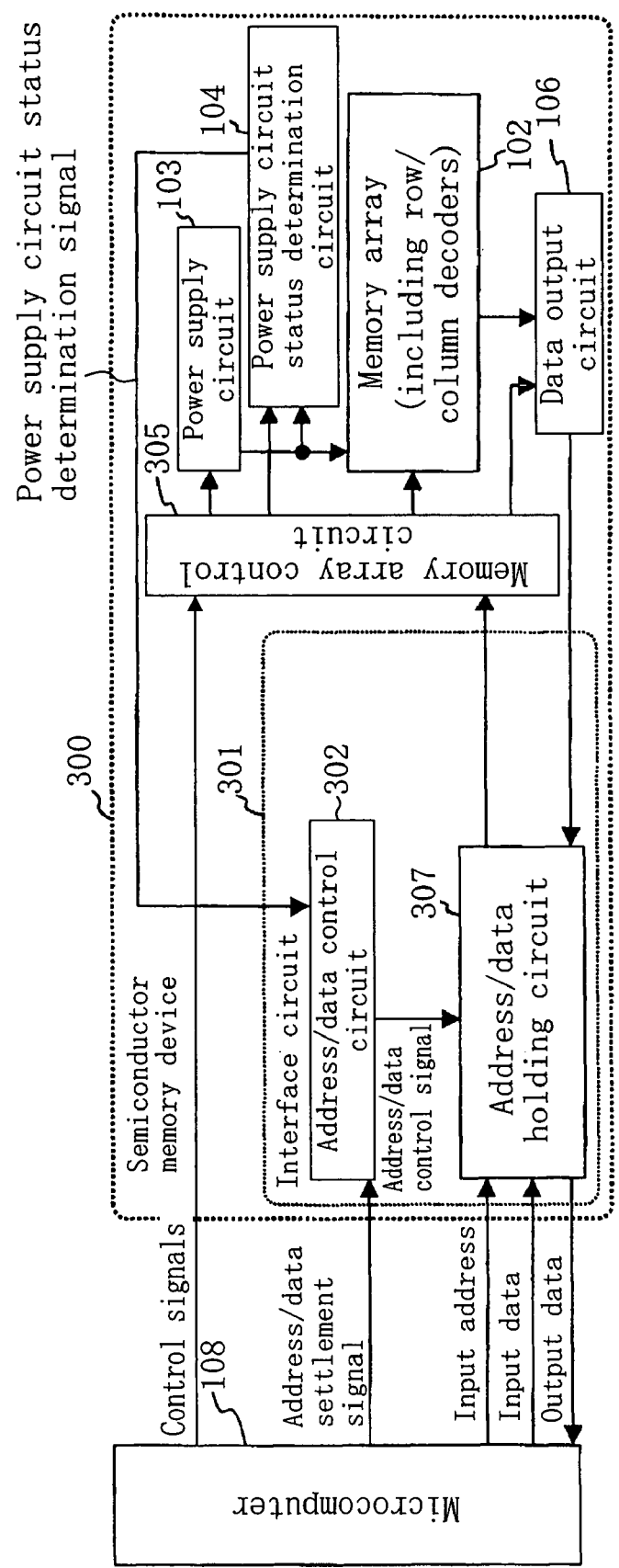
FIG. 5 is a block diagram showing a configuration of a semiconductor memory device 300 of Embodiment 3.

Referring to FIG. 5, a semiconductor memory device 300 of Embodiment 3 includes an interface circuit 301, the memory array 102, the power supply circuit 103 having a voltage boosting function, the power supply circuit status determination circuit 104, a memory array control circuit 305, and the data output circuit 106. The interface circuit 301 includes an address/data control circuit 302 and an address/data holding circuit 307.

The semiconductor memory device 300 receives, from a microcomputer 108, a plurality of control signals for controlling the semiconductor memory device 300, an address/data settlement signal, an input address, and input data. The plurality of control signals include a chip select signal, and a power supply circuit ON/OFF switching signal. The semiconductor memory device 300 outputs output data to the microcomputer 108. These signals are exchanged between the semiconductor memory device 300 and the microcomputer 108 in parallel transmission as shown in FIG. 5.

The chip select signal is a signal for controlling the validity of a read operation, a write operation, or the like of the semiconductor memory 300. When the chip select signal is low, the address, the data and other control signals are valid. When the chip select signal is high, the semiconductor memory device 300 does not operate even if it receives an address, data and other control signals.

The address/data settlement signal is a signal that indicates when the signal level of the input address has become stable.

The address/data control circuit 302 receives the power supply circuit status determination signal and the address/data settlement signal, and outputs an address/data control signal. The address/data control signal is a signal for controlling when to transmit the address and data held in the address/data holding circuit 307 to the memory array control circuit 305. The address/data control circuit 302 holds, but does not output, the address/data settlement signal while the power supply circuit 103 is not operating or is starting up. Then, the address/data settlement signal is not transmitted to the address/data holding circuit 307. When the power supply circuit 103 is completely in operation, the address/data control circuit 302 outputs the address/data settlement signal as the address/data control signal. In other words, the address/data settlement signal is transmitted to the address/data holding circuit 307.

The address/data holding circuit 307 receives the input address and the input data from the microcomputer 108. The address/data holding circuit 307 holds the received input address and the input data while the address/data control signal is high, and outputs the input address and the input data when the address/data control signal goes low. Moreover, the address/data holding circuit 307 receives the readout data from the data output circuit 106, and outputs the readout data as the output data. The output data is input to the microcomputer 108. The address/data holding circuit 307 outputs data all of which bits are zero data from when the power supply circuit 103 begins to start up until the address/data control signal becomes low. Thus, the output of the readout data is suppressed until the power supply circuit status determination signal becomes high.

The memory array control circuit 305 controls the power supply circuit 103, the power supply circuit status determination circuit 104 and the data output circuit 106 according to a plurality of control signals. The memory array control circuit 305 controls the row decoder and the column decoder of the memory array 102 to select a memory cell according to the input address output from the address/data holding circuit 307.

Figure 6:
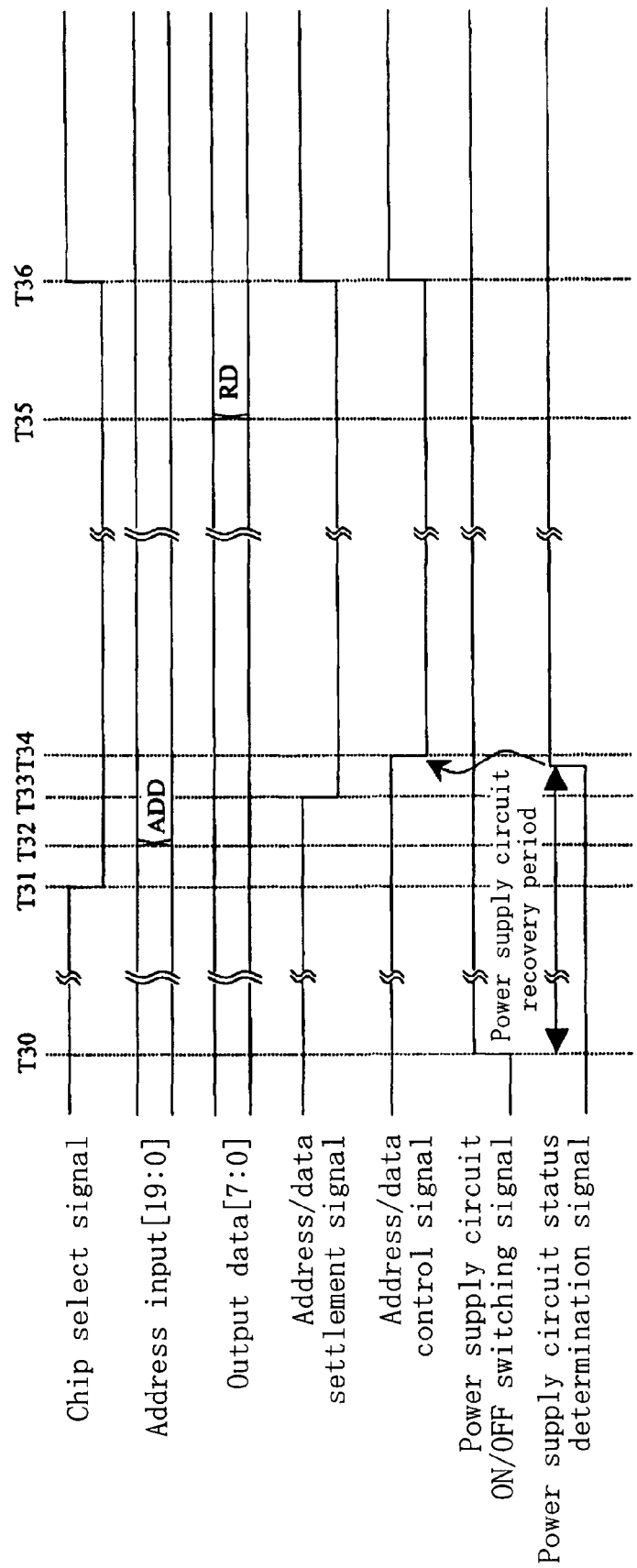
FIG. 6 is a timing diagram showing an operation of the semiconductor memory device 300 of Embodiment 3.

FIG. 6 is a timing diagram showing an operation of the semiconductor memory device 300 of the present embodiment. In this illustrated example, the input address is 20-bit data, and the output data is 8-bit data.

First, the power supply circuit ON/OFF switching signal is low, whereby the power supply circuit 103 is not operating, and the power supply circuit status determination signal from the power supply circuit status determination circuit 104 is low. At time T30, the power supply circuit ON/OFF switching signal goes high, and the power supply circuit 103 begins to start up. While the power supply circuit 103 is starting up (the power supply circuit recovery period), the microcomputer 108 brings the chip select signal to low (time T31). After the chip select signal is brought to low, the input address, being a read address, is output. The input address is held by the address/data holding circuit 307. Moreover, the microcomputer 108 brings the address/data settlement signal to low during the power supply circuit recovery period (time T33). At this point in time, the power supply circuit 103 is not operating and the power supply circuit status determination signal is low, whereby the address/data settlement signal is not transmitted to the address/data holding circuit 307, and the address/data control signal is kept high. All of the bits of the output data are zero data.

Then, when the start-up of the power supply circuit 103 is completed and the power supply circuit status determination signal goes high, the address/data control signal goes low and the input address held in the address/data holding circuit 307 is transmitted to the memory array control circuit 305, thus starting the read operation.

When the read operation by the semiconductor memory device 300 is completed, the readout data output from the data output circuit 106 is transmitted to the address/data holding circuit 307. Then, at time T35, the readout data is output from the semiconductor memory device 300 as the output data.

At time T36, as the address/data settlement signal goes high, the address/data control signal also goes high. Moreover, the chip select signal is brought to high, thus completing the read operation sequence.

When the start-up of the power supply circuit 103 has been completed, the address/data control circuit 302 transmits the address/data settlement signal to the address/data holding circuit 307 as the address/data control signal without once holding the signal therein. Therefore, when recovering the power supply circuit 103 from the inoperative state and reading out data from the semiconductor memory device 300, the microcomputer 108 can output the chip select signal, the address/data settlement signal, and the input address being a read address, without taking into consideration the power supply circuit recovery period.

As described above, with the semiconductor memory device 300 of the present embodiment, an input address that is input after the power supply circuit 103 begins to start up until the power supply circuit status determination signal becomes high is held by the address/data holding circuit 307. Therefore, after the start-up of the power supply circuit 103 is completed, the read operation can be started immediately without taking time to receive the input address from outside the semiconductor memory device 300. Therefore, the amount of time required for data to be read out is shorter than in a case where the semiconductor memory device 300 starts receiving the input address from outside the semiconductor memory device 300 after the start-up of the power supply circuit 103 is completed.

Moreover, it is not necessary to provide a timer circuit, or the like, around the microcomputer for normally reading out data. Therefore, the circuit area of the microcomputer peripheral circuit can be reduced.

Furthermore, with the semiconductor memory device 300, a low-level signal is output to terminals for the output data, thus suppressing the output of the readout data, after the power supply circuit begins to start up until the power supply circuit status determination signal becomes high. Thus, as long as the microcomputer 108 is configured so that the data read operation does not start while receiving output data whose bits are all low from the semiconductor memory device 300, it is possible to prevent the microcomputer 108 from running out of control, which would occur when erroneous data is read out. Moreover, the semiconductor memory device 300 does not need to have a dedicated terminal for outputting a signal, such as the power supply circuit status determination signal, that indicates that the status of the power supply circuit is such that data cannot be read out normally. Thus, the number of terminals of the semiconductor memory device can be reduced.

Embodiment 4

Figure 7:
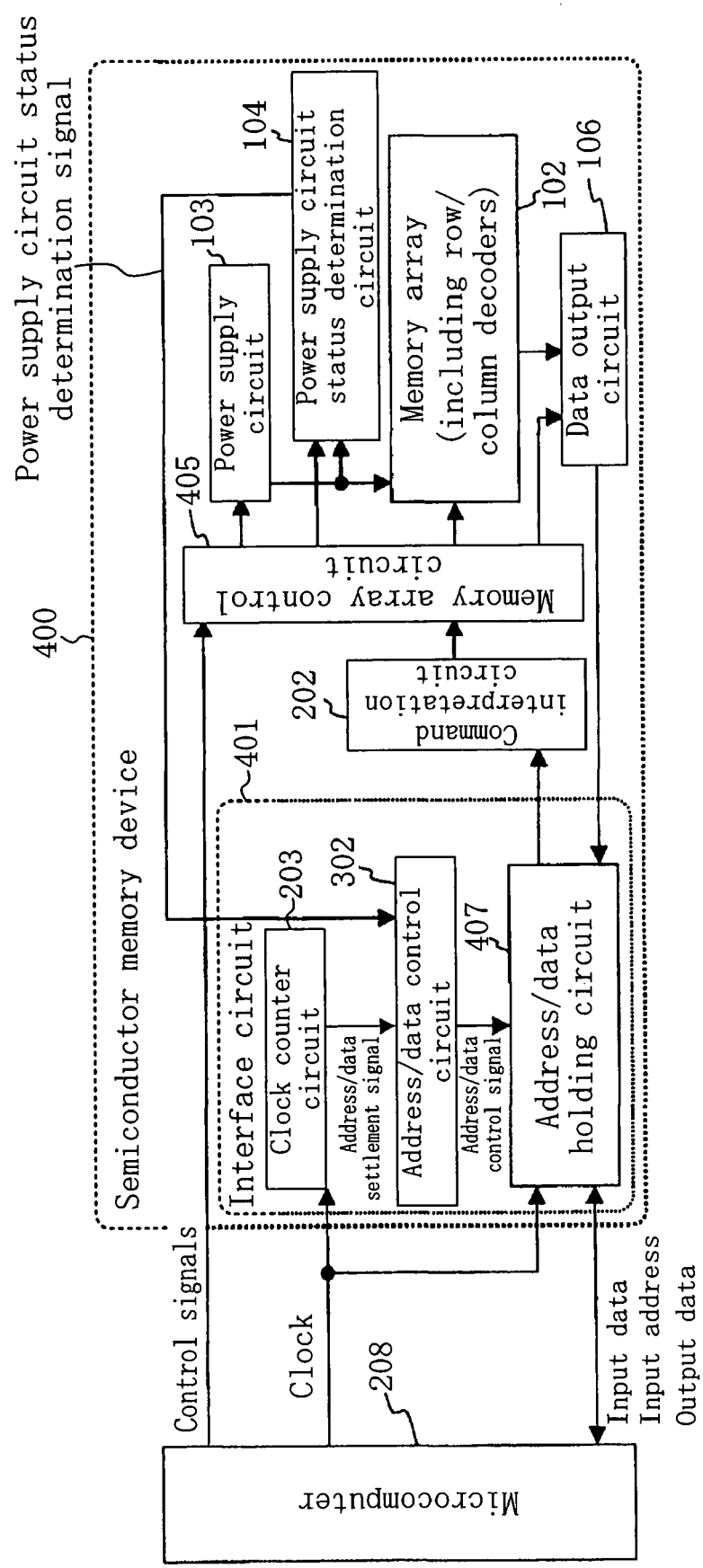
FIG. 7 is a block diagram showing a configuration of a semiconductor memory device 400 of Embodiment 4.

Referring to FIG. 7, the semiconductor memory device 400 of Embodiment 4 includes an interface circuit 401, the command interpretation circuit 202, the memory array 102, the power supply circuit 103 having a voltage boosting function, the power supply circuit status determination circuit 104, a memory array control circuit 405, and the data output circuit 106. The interface circuit 401 includes the clock counter circuit 203, the address/data control circuit 302, and an address/data holding circuit 407.

The semiconductor memory device 400 receives, from the microcomputer 208, a plurality of control signals for controlling the semiconductor memory device 400, a clock signal, an input address, and input data. The plurality of control signals include a chip select signal. The semiconductor memory device 400 outputs output data to the microcomputer 208. In the present embodiment, the input address, the input data and the output data are exchanged between the semiconductor memory device 400 and the microcomputer 208 in serial transmission as shown in FIG. 7. The semiconductor memory device 400 receives the input address and the input data, and outputs the output data via common terminals.

The chip select signal is a signal for controlling the validity of a read operation, a write operation, or the like of the semiconductor memory 400. When the chip select signal is low, the address, the data and other control signals are valid. When the chip select signal is high, the semiconductor memory device 400 does not operate even if it receives an address, data and other control signals.

According to the plurality of control signals and the command signal output from the command interpretation circuit 202, the memory array control circuit 405 controls the power supply circuit 103, the power supply circuit status determination circuit 104 and the data output circuit 106, and controls the row decoder and the column decoder of the memory array 102 to select a memory cell.

The address/data holding circuit 407 receives, in synchronism with a clock signal having a predetermined period, the input address and the input data received as serial data from the microcomputer 208. The address/data holding circuit 407 holds the received input address and the input data while the address/data control signal is high, and outputs the input address and the input data when the address/data control signal goes low. While the power supply circuit 103 is not operating or is starting up, the address/data settlement signal is not transmitted to the address/data holding circuit 407. While the power supply circuit 103 is completely in operation, the address/data settlement signal is transmitted to the address/data holding circuit 407 as the address/data control signal.

The address/data holding circuit 407 is switched by an input/output switching signal between a state where it receives the input address and the input data and another state where it outputs the output data. The input/output switching signal is an internal signal of the address/data holding circuit 407. When the input/output switching signal is low, the address/data holding circuit 407 is in a state where it receives the input address and the input data. When the input/output switching signal is high, the address/data holding circuit 407 is in a state where it outputs the output data. The input/output switching signal is kept low during the time when the address/data control signal is high.

FIG. 8 is a timing diagram showing an operation of the semiconductor memory device 400 of the present embodiment. In the illustrated example, the input address, the input data and the output data are exchanged via a 4-bit bus, the input address is 20-bit data, and the output data is 8-bit data. The latch address LA[19:0] is an address held by the address/data holding circuit 407.

First, the power supply circuit ON/OFF switching signal is low, whereby the power supply circuit 103 is not operating, and the power supply circuit status determination signal from the power supply circuit status determination circuit 104 is low.

At time T40, the power supply circuit ON/OFF switching signal goes high, and the power supply circuit 103 begins to start up.

While the power supply circuit 103 is starting up (the power supply circuit recovery period), the microcomputer 208 brings the chip select signal to low (time T41). After the chip select signal is brought to low, the input address being a read address is input from the microcomputer 208 to the semiconductor memory device 400 by four bits each time the clock signal rises (in synchronism with the clock signal). The received input address is stored in the address/data holding circuit 407, successively taking up storage positions starting from the position corresponding to the most significant bits of the latch address LA[19:0].

When the read address has been stored in the storage positions corresponding to all the bits of the latch address LA[19:0] of the address/data holding circuit 407 at time T42, the address/data settlement signal goes low. At this point in time, the power supply circuit 103 is not operating and the power supply circuit status determination signal is low, whereby the address/data settlement signal is not transmitted to the address/data holding circuit 407, and the address/data control signal is kept high.

Then, when the start-up of the power supply circuit 103 is completed and the power supply circuit status determination signal goes high, the address/data control signal goes low and the latch address LA[19:0] held in the address/data holding circuit 407 is transmitted to the command interpretation circuit 202, thus starting the read operation. At time T43, the address/data control signal goes low to allow the input/output switching signal to go high, thereby bringing the address/data holding circuit 407 to a state where it outputs the output data. Then, when the read operation by the semiconductor memory device 400 is completed, the readout data output from the data output circuit 106 is transmitted to the address/data holding circuit 407. At time T44, the readout data is output, as the output data, in serial transmission in synchronism with the clock signal. Then, the microcomputer 208 brings the chip select signal to high at time T45, thus completing the read operation sequence. Then, at time T46, the input/output switching signal goes low, thereby bringing the address/data holding circuit 407 to a state where it receives the input address and the input data.

When the start-up of the power supply circuit 103 has been completed, the address/data control circuit 302 transmits the address/data settlement signal to the address/data holding circuit 407 as the address/data control signal without once holding the signal therein. Therefore, when recovering the power supply circuit 103 from the inoperative state and reading out data from the semiconductor memory device 400, the microcomputer 208 can output the chip select signal, the address/data settlement signal, and the input address being a read address, without taking into consideration the power supply circuit recovery period.

As described above, with the semiconductor memory device 400 of the present embodiment, an input address that is input after the power supply circuit 103 begins to start up until the power supply circuit status determination signal becomes high is held by the address/data holding circuit 407. Therefore, after the start-up of the power supply circuit 103 is completed, the read operation can be started immediately without taking time to receive the input address from outside the semiconductor memory device 400. Therefore, the amount of time required for data to be read out is shorter than in a case where the semiconductor memory device 400 starts receiving the input address from outside the semiconductor memory device 400 after the start-up of the power supply circuit 103 is completed.

Moreover, it is not necessary to provide a timer circuit, or the like, around the microcomputer for normally reading out data. Therefore, the circuit area of the microcomputer peripheral circuit can be reduced.

Moreover, the address/data holding circuit 407 does not enter the data output state until the power supply circuit status determination signal becomes high after the power supply circuit 103 begins to start up. Thus, it is possible to prevent erroneous readout data from being read out by the microcomputer 208 while the power supply circuit 103 is not outputting the power supply voltage of a sufficient voltage level. Moreover, the semiconductor memory device 400 does not need to have a dedicated terminal for outputting a signal, such as the power supply circuit status determination signal, that indicates that the status of the power supply circuit is such that data cannot be read out normally. Thus, the number of terminals of the semiconductor memory device can be reduced.

Alternative Embodiments

In Embodiments 1 and 3, the power supply circuit ON/OFF switching signal, which is input from outside the semiconductor memory device, is used to control when the power supply circuit 103 starts up. Alternatively, the power supply circuit ON/OFF switching signal may be used to control when the power supply circuit 103 shuts down.

In Embodiments 2 and 4, the command interpretation circuit 202 determines if a pair of a predetermined address and predetermined write data has been input a predetermined number of times. Alternatively, the command interpretation circuit 202 may simply determine if a predetermined address or predetermined write data has been input. In these embodiments, the determination result of the command interpretation circuit 202 is used to control when the power supply circuit 103 starts up. Alternatively, the determination result may be used to control when the power supply circuit 103 shuts down.

The present invention has an advantage in that the number of terminals of a semiconductor memory device can be reduced, and is applicable to a semiconductor memory device using semiconductor memory elements of any type or structure, e.g., a semiconductor memory device having a voltage booster circuit, in which stored data is read out by using a voltage boosted by the voltage booster circuit.

What is claimed is:

1. A semiconductor memory device, comprising:
a power supply circuit for outputting a power supply voltage used for reading out data; and
a power supply circuit status determination circuit for determining whether an operation status of the power supply circuit is such that data can be read out normally,
wherein output of readout data is suppressed while it is determined by the power supply circuit status determination circuit that the operation status is such that data cannot be read out normally.

2. The semiconductor memory device of claim 1, wherein the power supply circuit has a voltage booster circuit.

3. The semiconductor memory device of claim 1, wherein predetermined data is output instead of the readout data while it is determined by the power supply circuit status determination circuit that the operation status is such that data cannot be read out normally.

4. The semiconductor memory device of claim 1, wherein:
a read address is received and the readout data is output via a common terminal; and
the terminal accepts the read address while it is determined by the power supply circuit status determination circuit that the operation status is such that data cannot be read out normally.

5. The semiconductor memory device of claim 1, wherein the power supply circuit status determination circuit determines whether the operation status is such that data can be read out normally based on a level of the power supply voltage.

6. The semiconductor memory device of claim 5, wherein the power supply circuit status determination circuit determines that the operation status is such that data can be read out normally when the level of the power supply voltage is greater than or equal to a predetermined level, and determines that the operation status is such that data cannot be read out normally when the level of the power supply voltage is less than the predetermined level.

7. The semiconductor memory device of claim 6, further comprising an address holding circuit for holding an address that is input before it is determined by the power supply circuit status determination circuit that the operation status is such that data can be read out normally after start-up of the power supply circuit,
wherein the address held by the address holding circuit is used for reading out data after it is determined by the power supply circuit status determination circuit that the operation status is such that data can be read out normally and input of the readout address is completed.

8. The semiconductor memory device of claim 7, wherein the power supply circuit starts up and shuts down according to a power supply circuit ON/OFF switching signal, which is input from outside the semiconductor memory device.

9. The semiconductor memory device of claim 7, further comprising a command interpretation circuit for determining whether a predetermined address or predetermined data has been input from outside the semiconductor memory device,
wherein the power supply circuit starts up or shuts down when it is determined that the predetermined address or the predetermined data has been input.

10. The semiconductor memory device of claim 9, wherein:
the command interpretation circuit determines whether a pair of a predetermined address and predetermined data has been input a predetermined number of times; and
the power supply circuit starts up or shuts down when the pair has been input the predetermined number of times.

11. The semiconductor memory device of claim 10, wherein an address and data, which are input as serial data, are received in synchronism with a clock signal having a predetermined period.

12. The semiconductor memory device of claim 11, wherein the address and the data are received and the readout data is output via a common terminal.

13. A data transmitting/receiving system, comprising:
the semiconductor memory device of claim 7; and
an information processing device for outputting an address, data and a control signal for controlling the semiconductor memory device, which are input to the semiconductor memory device, and for receiving readout data, which is output from the semiconductor memory device.

* * * * *